United States Patent [19]

Wolfe

[11] 4,085,330
[45] Apr. 18, 1978

[54] FOCUSED ION BEAM MASK MAKER

[75] Inventor: John Edmond Wolfe, Escondido, Calif.

[73] Assignee: Burroughs Corporation, Detroit, Mich.

[21] Appl. No.: 798,392

[22] Filed: May 19, 1977

Related U.S. Application Data

[63] Continuation of Ser. No. 703,633, Jul. 8, 1976, abandoned.

[51] Int. Cl.² .......................................... H01J 37/08
[52] U.S. Cl. ............................... 250/492 A; 250/398; 250/423 P
[58] Field of Search ............... 250/492 A, 492 R, 396, 250/398, 423 F; 204/192 E

[56] References Cited

U.S. PATENT DOCUMENTS

| | | | |
|---|---|---|---|
| 2,809,314 | 10/1957 | Herb | 250/423 F |
| 3,682,729 | 8/1972 | Gukelberger et al. | 250/492 A |
| 3,699,334 | 10/1972 | Cohen et al. | 250/492 A |
| 3,786,359 | 1/1974 | King | 250/492 A |
| 3,855,023 | 12/1974 | Spicer et al. | 250/492 A |

Primary Examiner—Bruce C. Anderson
Attorney, Agent, or Firm—Mervyn L. Young; Kevin R. Peterson

[57] ABSTRACT

A method of making a pattern for a photolithographic mask. A field ion source is advantageously utilized to produce heavy ions with a high beam current density. The ions are accelerated and directly bombard a metallic coating on the mask substrate to form openings therein in the desired pattern.

20 Claims, 2 Drawing Figures

FOCUSED ION BEAM MASK MAKER

This is a continuation of application Ser. No. 703,633, filed July 8, 1976, now abandoned.

BACKGROUND OF THE INVENTION

This invention relates to a method of making a photolithographic mask. More particularly, it involves the use of an ion beam to selectively remove portions of a metallic layer on a transparent mask substrate in a desired pattern.

Photolithographic masks are widely used in semiconductor processing. One well known use for such masks is in selectively exposing resist on a semiconductor wafer. Briefly, these masks consist of a transparent glass substrate with a metallic coating on one surface. The metallic coating has openings therein in a desired pattern. Consequently, when the mask is placed over the semiconductor wafer, ultraviolet light, which used to expose the resist, passes only through the openings in the metallic coating on the mask. The remainder of the wafer is protected by the opaque metallic coating.

The pattern in the metallic coating for the masks has heretofore been made by chemical etching techniques. Briefly, the unpatterned metallic coating is covered with a layer of resist. Photoresists or electron resists have both been employed. Selected portions of the chosen resist are then exposed in the desired pattern. Using the photoresist, another mask is used to screen out undesired ultraviolet light. If the electron resist is used, then a low energy scanning electron beam can be used to selectively polymerize the electron resist. In either case, the unexposed resist must be washed away and the underlying metallic coating subsequently subjected to a chemical etchant bath. Using the resist as a protective screen, the unprotected portions of the underlying metallic coating are removed by the etchant to form the desired pattern. The resist is then removed to leave the completed mask.

In integrated circuit manufacturing, it is paramount that the mask pattern be well defined and preferably provide extremely fine line patterns. Unfortunately, the above mentioned techniques have their limitations. For example, with the electron beam exposure technique, the electron beam laterally scatters the electrons in the resist thereby causing a wider pattern than desired. Furthermore, the sensitivity of the electron beam positioning the ambient magnetic fields, the chromatic aberration effects which limit the current density, and the noticeable diffraction effects due to the non-negligible wave lengths of the electrons, all tend to inhibit accurate resolution of the mask pattern. It would be advantageous to provide a method of making a photolithographic mask in which the metallic coating on the transparent substrate could be selectively removed in the desired pattern without the use of the time consuming and inaccurate resist masking and chemical etching steps.

OBJECT AND SUMMARY OF THE INVENTION

Therefore, it is the primary object of this invention to provide a method of making a photolithographic mask in which selected portions of the opaque coating are directly removed to thereby produce a fine resolution pattern therein.

This and other objects of this invention are accomplished by utilizing a field ion source to produce a high beam current density of heavy ions. The ions are accelerated and directly bombard a metallic coating on the mask to selectively remove the metal in the desired pattern. The field ion source preferably includes a needle anode having a tip with a radius of less than 5,000 A. A xenon gas source or gallium liquid source are preferably utilized to provide a source of ionizable atoms. Ionization occurs at the tip of the needle anode, the ions are accelerated and then focused into a beam of high current density. The ion beam traverses over the metallic coating in the desired pattern with the ion beam striking the metallic atoms with such force as to remove them from the underlying transparent substrate. Through the use of this invention, a mask can be provided with a much finer resolution than in the prior art methods. Furthermore, the burdensome step of resist application, exposure, removal, and etching the metallic coating have been eliminated.

DESCRIPTION OF THE PREFERRED EMBODIMENT

Figure 1:
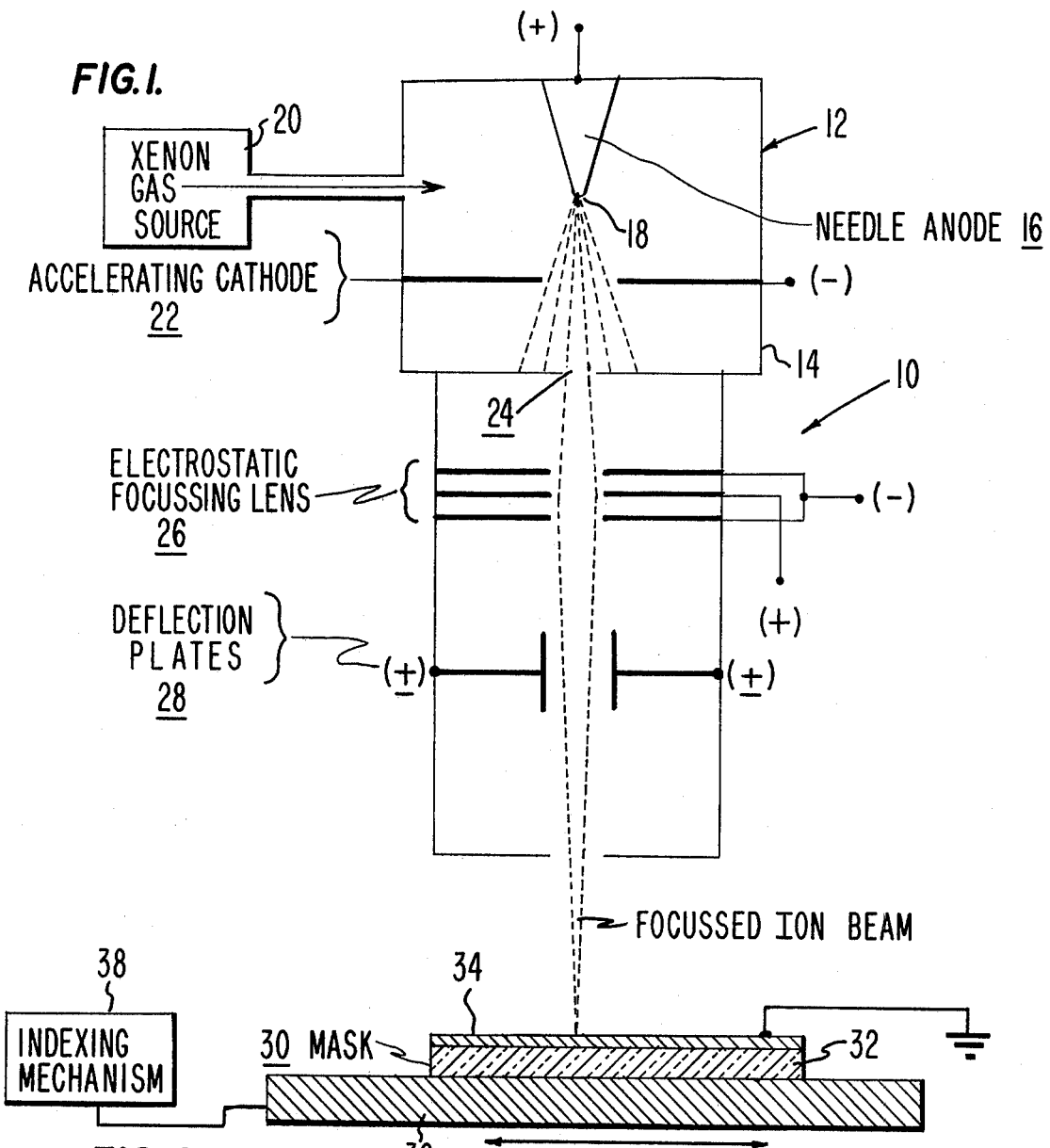
FIG. 1 shows a cross sectional view of one embodiment of the apparatus which may be utilized in carrying out the method of this invention.

Referring now to FIG. 1, there is shown a schematic diagram of one example of the apparatus that can be used in carrying out the method of this invention. An ion gun for producing a focused ion beam is generally designated by the numeral 10. The gun 10, as well as the workpiece, are housed in an evacuated system having a vacuum pressure of at least $10^{-5}$ mm. Hg.

It is a feature of this invention that ion gun 10 includes a field ion source 12. Field ion source 12 includes a chamber 14 having a needle anode 16 with a tip 18 which projects within the confines of chamber 14. The needle anode 16 is preferably constructed of iridium metal and is in the shape of a tapered rod terminating at tip 18. It is preferred that the tip 18 have a radius of not more than about 5000 A in order to provide a high ion beam current density for purposes of this invention. The end of anode 16 opposite tip 18 is connected to a positive potential, preferably in the range of 10-30 kilovolts with respect to ground. In the apparatus as shown in FIG. 1, a gas source 20 is utilized to provide a source of ionizable inert atoms. An inert gas such as xenon, is preferably used to prevent any reaction with other molecules which may be present in the system. Not only is xenon an inert element but it has a high mass as evidenced by its atomic weight of 131.30. The xenon gas is fed into chamber 14 at a pressure of about $10^{-2}$ millimeters of Hg. As the gas passes over tip 18 of needle anode 16, the high potential thereon strips an electron away from the atoms of xenon by tunneling to form positive ions. Immediately after formation, the positive ions are attracted by the negatively charged accelerating cathode 22. In this embodiment, cathode 22 is at a negative potential of about 10-30 kilovolts with respect to anode 16. Chamber 14 includes an aperture of iris 24 disposed in the line of fire between anode tip 18 and the workpiece. Iris 24 begins to define the accelerated ions into a beam and limits the angular aperture of the focussing lens 26.

The field ion source 12 produces a beam current of 1 $\times$ $10^{-7} - 10^{-10}$ amperes. A field ion source is necessary in order to provide a current of at least $1 \times 10^{-10}$ amperes which is necessary in carrying out this invention. By a field ion source we mean a source which produces ions from an unheated needle forming a high electrical field emanating from it. This is to be differentiated from plasma and thermally activated ion sources. The plasma source, such as the Dupolasmatron source used in U.S. Pat. No. 3,699,334 Cohen et al, is disadvantageous because of its wide energy spread of the ion source and its low brightness. Similarly, a thermally activated ion source, such as that disclosed in U.S. Pat. No. 3,385,949 Heil, has the same disadvantages. In comparison, the field ion source of this invention provides a large current output of at least $1 \times 10^{-10}$ amperes which can be focussed to an extremely small beam spot size of at least 1000 A in diameter.

As the ion beam exits iris 24, it passes between the centrally located openings in the electrostatic focusing lenses 26. In this example, lenses 26 include three vertically spaced metallic disks in which the upper and lower disk are connected to a negative potential with respect to the needle anode 16, whereas the middle disk has a positive potential applied to it. The lenses are preferably of a high quality in order to resolve the virtual source of the tip 18 of needle anode 16. It is important that the beam be kept as small as possible in order to increase the current density and provide a high resolution pattern for the mask. Through the combination of the field ion source 12 and the lens 26, the ion beam can be focussed into a beam of extremely high current density.

Downstream from the lenses 26 are deflection plates 28 which serve to position the beam. The beam can be made to scan the surface of the mask by regulating the relative potential on the deflection plates 28. For example, a positive charge on one of the plates and a negative charge on the other plate will move the beam towards the negatively charged plate. Reversing the polarities will move the beam in the opposite direction.

The mask 30 includes a transparent substrate 32, such as quartz, having a thin opaque metallic coating 34 on the entire upper surface thereof. In this embodiment, mask 30 is positioned approximately 5-20 cm from lens 26. The focussing lenses 26 focus the beam into a spot having a diameter of no more than 5000 A at the surface of coating 34 thereby providing an extremely high beam current density. The back of the glass substrate 32 is preferably mounted on the surface of a moving table 36. The metallic coating 34 is grounded to thereby provide a potential between the mask coating 34 and needle anode source 16 of between 10-30 Kv. Table 36 can be attached to an automatic index mechanism 38 which moves the table in such manner that the ion beam strikes the metal coating 34 in the desired pattern. Alternately, the beam can be scanned by the deflection plates 28 in the desired configuration, or a combination of both may be used.

When the beam strikes the metal coating 34, the metal is removed from the glass substrate to form openings in the opaque metal coating 34 to create the desired pattern. It is believed that this phenomena is due to the ions striking the metal atoms of coating 34 with such force as to break the cohesive bonds in the metal coating 34, with the result of the freed atoms being removed from the substrate 32. Preferably, the metallic coating 34 is a gold layer about 500-1000 A thick. Increased removal rates of about 2.5 meters/second are possible with the combination of the xenon ion beam and the gold mask coating. It is believed that this phenomena is due to the fact that there is a relative matching of the atom weights of the two elements thereby maximizing the energy imparted when the xenon ions strikes the gold atoms. While gold is preferred for coating 34, other metals such as chromium may be removed at satisfactory rates.

Figure 2:
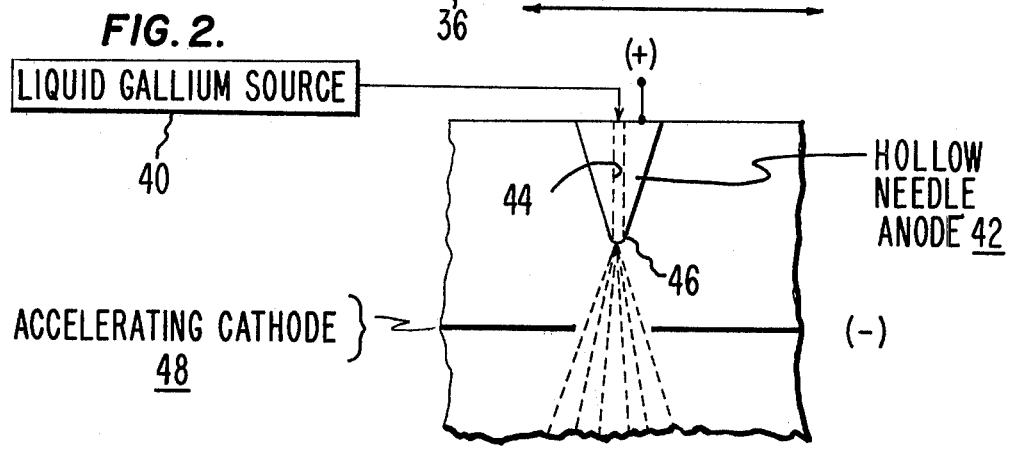
FIG. 2 shows a partial cross sectional view of a liquid ion source which may be utilized with the apparatus shown in FIG. 1 instead of a gaseous ion source as shown in FIG. 1.

Referring now to FIG. 2, there is shown a modification of the field ion source 12 as shown in FIG. 1. In this modification, a liquid source of ionizable atoms is provided as compare to the gaseous source of FIG. 1. Liquid source 40 communicates with needle anode 42. Needle anode 42 in this example is substantially the same as that of anode 16 of FIG. 1 except that it includes a centrally located bore 44 which provides a passageway between the liquid source 40 and tip 46 of the anode. The liquid is fed via bore 44 to the tip of the needle anode 42 where the atoms are ionized and accelerated toward the mask by the accelerating cathode 48. The use of a liquid source of ionizable atoms may be more advantageous than the gaseous source in some instances. For example, the ionizable element chosen need not be as inert as the element in the gaseous source since the liquid source system can be evacuated to a much greater extent than the gaseous source. In order for the gas source to force the ionizable gas into the chamber, there need be somewhat of pressure differential therebetween. Consequently, there is a possiblilty of undesirable elements remaining in the system which may combine with the source of ions. However, with the liquid source the liquid can be fed to the tip without any significant pressure differential, for example, by gravity or by capillary action. Consequently, the element need not be inert.

Gallium provides one of the most desirable source of liquid ionizable atoms. Not only does it have a relatively high atomic weight of 69.72 and liquidifies at nearly room temperature of 29.8° C, it also has a very low vapor pressure at its melting point. Therefore, no extraneous heating means are necessary to melt the material before entry into the anode 42. Moreover, gallium has been found to produce an extremely high current density with a field ion source.

From the foregoing description, it can now be realized that this invention provides an extremely useful method of making photolithographic masks. Not only does it eliminate the need of the time consuming resist masking and etching steps, it provides a pattern for the mask which has a finer resolution than was attainable by the earlier known method.

I claim:

1. In a method of making a pattern on a photolithographic mask for semiconductor devices wherein the mask has a metallic coating on a surface of a transparent substrate, the improvement comprising:
   using a field ion source to produce a beam of ions;
   accelerating the ions; and
   directly bombarding the metallic coating on the mask substrate with the accelerated ions to form openings in the coating in a desired pattern.

2. The method of claim 1 wherein the field ion source produces an ion beam having a current of at least $1 \times 10^{-10}$ amperes.

3. The method of claim 2 which further includes the step of focusing the ion beam to produce a spot size on the coating of less than 5000 A in diameter.

4. In a method of making a pattern on a photolithographic mask wherein the mask has a metallic coating on a surface of a transparent substrate, the improvement comprising:

introducing xenon gas into the chamber of a field ion source including a needle anode having a tip with a radius of less than 5000 A;

ionizing the gas as it passes over the tip of said needle anode to produce xenon ions;

accelerating the ions;

focussing the ions into a beam having a spot size of less than 1000 A in diameter at the metallic coating; and bombarding the metallic coating of the mask with the accelerated ion beam to selectively remove the metal to form openings therein in a desired pattern.

5. The method of claim 4 wherein the field ion source produces a current of at least $1 \times 10^{-10}$ amperes.

6. The method of claim 5 wherein the needle anode is at a positive potential of between 10–30 kilovolts with respect to said metallic coating.

7. The method of claim 6 wherein the metallic coating is gold.

8. In a method of making a pattern on a photolithographic mask for semiconductor devices wherein the mask has a metallic coating on a surface of a transparent substrate, the improvement comprising:

feeding liquidified gallium to the tip of a needle anode in a field ion source;

ionizing the liquid as it reaches the tip of said needle anode to produce gallium ions;

accelerating the ions;

focussing the ions into a beam having a spot size of less than 1000 A in diameter at the metallic coating; and bombarding the metallic coating of the mask with the accelerated ion beam to selectively remove the metal to form openings therein in a desired pattern.

9. The method of claim 8 wherein the field ion source produces a current of at least $1 \times 10^{-10}$ amperes.

10. The method of claim 9 wherein the liquid gallium is fed through a bore in the needle anode, and wherein the tip of the needle anode has a radius of less than 5000 A.

11. In a method of making a pattern on semiconductor devices wherein such devices have a coating on a surface of a substrate, the improvement comprising:

using a field ion source to produce a beam of ions;

accelerating the ions; and directly bombarding the coating on the substrate with the accelerated ions to form openings in the coating in a desired pattern.

12. The method of claim 11 wherein the field ion source produces an ion beam having a current of at least $1 \times 10^{-10}$ amperes.

13. The method of claim 12 which further includes the step of focusing the ion beam to produce a spot size on the coating of less than 5000 A in diameter.

14. In a method of making a pattern on a device which has a coating on a surface of a substrate, the improvement comprising:

introducing xenon gas into the chamber of a field ion source including a needle anode having a tip with a radius of less than 5000 A;

ionizing the gas as it passes over the tip of said needle anode to produce xenon ions;

accelerating the ions;

focussing the ions into a beam having a spot size of less than 1000 A in diameter at the coating; and bombarding the coating of the substrate with the accelerated ion beam to selectively remove the coating to form openings therein in a desired pattern.

15. The method of claim 14 wherein the field ion source produces a current of at least $1 \times 10^{-10}$ amperes.

16. The method of claim 15 wherein the needle anode is at a positive potential of between 10–30 kilovolts with respect to said metallic coating.

17. The method of claim 16 wherein the coating is gold.

18. In a method of making a pattern on semiconductor devices wherein such devices have a coating on a surface of a substrate, the improvement comprising:

feeding liquidified gallium to the tip of a needle anode in a field ion source;

ionizing the liquid as it reaches the tip of said needle anode to produce gallium ions;

accelerating the ions;

focussing the ions into a beam having a spot size of less than 1000 A in diameter at the coating; and bombarding the coating of the substrate with the accelerated ion beam to selectively remove the coating to form openings therein in a desired pattern.

19. The method of claim 18 wherein the field ion source produces a current of at least $1 \times 10^{-10}$ amperes.

20. The method of claim 19 wherein the liquid gallium is fed through a bore in the needle anode, and wherein the top of the needle anode has a radius of less than 5000 A.

* * * * *